United States Patent [19]

Olson

[11] Patent Number: 4,481,232

[45] Date of Patent: Nov. 6, 1984

[54] METHOD AND APPARATUS FOR PRODUCING HIGH PURITY SILICON

[75] Inventor: Jerry M. Olson, Lakewood, Colo.

[73] Assignee: The United States of America as represented by the Department of Energy, Washington, D.C.

[21] Appl. No.: 498,999

[22] Filed: May 27, 1983

[51] Int. Cl.³ .................. B05D 3/14; C23C 11/00; C01B 33/02

[52] U.S. Cl. .................................. 427/51; 427/52; 427/255; 118/725; 118/726; 118/733; 423/349

[58] Field of Search ............. 427/51, 52, 253, 399, 427/255; 156/613; 423/342, 348, 349, 350; 118/725, 726, 733

[56] References Cited

U.S. PATENT DOCUMENTS 2,499,009  2/1950  Wagner .......................... 423/342
3,058,812 10/1962  Chu et al. ....................... 427/51

Primary Examiner—Michael R. Lusignan
Assistant Examiner—K. E. Jaconethy
Attorney, Agent, or Firm—Kenneth L. Richardson; James W. Weinberger; Michael F. Esposito

[57] ABSTRACT

A method for producing high purity silicon includes forming a copper silicide alloy and positioning the alloy within an enclosure. A filament member is also placed within the enclosure opposite the alloy. The enclosure is then filled with a chemical vapor transport gas adapted for transporting silicon. Finally, both the filament member and the alloy are heated to temperatures sufficient to cause the gas to react with silicon at the alloy surface and deposit the reacted silicon on the filament member. In addition, an apparatus for carrying out this method is also disclosed.

21 Claims, 3 Drawing Figures

METHOD AND APPARATUS FOR PRODUCING HIGH PURITY SILICON

CONTRACTUAL ORIGIN OF THE INVENTION

The U.S. Government has rights in this invention pursuant to Contract No. EG-77-C-01-4042 between the U.S. Department of Energy and the Midwest Research Institute.

BACKGROUND OF THE INVENTION

1. Field of the Invention

This invention relates to silicon production and more particularly to processes and devices for producing high purity silicon. Specifically, this invention relates to a process and apparatus for refining impure silicon, such as metallurgical grade silicon, to form high purity silicon usable in photovoltaic solar cells, semiconductor devices and the like.

2. Description of the Prior Art

High purity silicon is both useful and oftentimes required for a wide variety of industrial applications. One such application is in the area of photovoltaic solar cells. In such photovoltaic cells, thin sheets or wafers of highly refined silicon form at least the upper surface of a multi-layered cell adapted for direct conversion of incident solar radiation to an electrical potential. To date, the processes and techniques available to produce high purity silicon and to subsequently form such silicon into thin sheets or wafers are extremely expensive.

One commonly used technique for electrochemically purifying silicon is an adaptation of a well-known aluminum refining process. In this technique, silicon is substituted for aluminum to provide an electrochemical process utilizing a molten Cu/Si anode with Na-based based molten electrolyte. The electrolyte contains Na$_3$AlF$_6$ for transporting silicon to a cathode. An example of such a process is disclosed in the French paper by R. Monnier and J. C. Giacometti entitled, "Recherches sur la Raffinage Electrolytique du Silicium," Helvetica Chimica Acta, Vol. 47,345, (1964).

There are several significant problems with the above described type of system. One such problem is that since the anode must be molten, only a single electrode pair per electrochemical cell can be utilized. Therefore, silicon deposition per unit cell volume on the cathode proceeds rather slowly. Furthermore, due to the dynamics of such cells, large electrolyte vapor losses result from the high cell operating temperatures. Consequently, this particular system is not very economical.

Another known electrochemical process for plating Si is described in a paper by Uri Cohen entitled, "Some Prospective Applications of Silicon Electrodeposition from Molten Fluorides to Solar Cell Fabrication," J. Electronic Mat'ls., Vol. 6, #6, 607 (1977). In this particular process, a LiF, KF, K$_2$SiF$_6$ molten salt electrolyte is used to plate silicon onto a graphite cathode. However, a substantially pure solid sheet Si anode is required. Thus, this technique has no practical application for use with metallurgical grade or other impure silicon.

Still another electrochemical process is disclosed in U.S. patent application Ser. No. 387,115, filed June 10, 1982, and assigned to the assignee of the present invention. In this process, a Cu/Si anode is used as a silicon source for electrochemical deposition of Si onto a graphite cathode in a molten salt electrolyte.

Other techniques presently being utilized to produce highly pure silicon for the semiconductor and photovoltaic industries include well-known distillation processes as well as various chemical conversion techniques. One such common technique includes the conversion of metallurgical grade silicon to a basic intermediate trichlorosilane (HSiCl$_3$) via a fluidized bed reaction with anhydrous hydrogen chloride as indicated in reaction equation 1 below.

$$Si + 3HCl = HSiCl_3 + H_2 \quad (1)$$

This is followed by the purification of the trichlorosilane by distillation and then a subsequent deposition of semiconductor grade silicon via chemical vapor deposition from trichlorosilane in the presence of hydrogen as indicated by reaction equation 2 below.

$$HSiCl_3 + H_2 = Si + 3HCl \quad (2)$$

Typically, the deposition of silicon from trichlorosilane in the presence of hydrogen may take place in a Siemens-type reactor. However, the Siemens reactor is not complete in that unreacted trichlorosilane and H$_2$ as well as SiCl$_4$ are produced in addition to the silicon and hydrogen chloride. The above technique is thoroughly disclosed in a Dow Corning report entitled, "Polysilicon Technology," by Leon D. Crossman and John A. Baker, which report also appeared in "Semiconductor Silicon 1977," H. R. Huff and E. Cirtl, editors, The Electrochemical Society Softbound Symposium Series, Princeton, N. J. (1977). This technique is very expensive to operate in order to produce sufficient quantities of highly pure or refined silicon due to the inefficiency of this Siemens-type reactor as well as due to the numerous different process stages required in this overall technique.

One of the major problems and hurdles facing the photovoltaic industry is in reducing the costs associated with producing photovoltaic cells. Efficient photovoltaic cells utilizing silicon are, in fact, presently available and could readily be utilized on a mass basis if it were not for a prohibitive pricing structure. An important aspect of this pricing structure is the direct result of the high cost of purifying silicon and forming such purified silicon into thin wafers or sheets. The present invention meets both these needs of the photovoltaic industry, as well as the related semiconductor industry, by providing highly refined silicon at an economical cost as well as providing such highly refined silicon potentially in sheet form at no substantial additional cost.

SUMMARY OF THE INVENTION

Therefore, it is one object of the present invention to provide a method and apparatus for producing high purity silicon.

It is another object of the present invention to provide a method and apparatus for refining metallurgical grade silicon into highly pure silicon capable of use in photovoltaic solar cells and semiconductor devices.

It is yet another object of the present invention to provide a method and apparatus for producing substantially planar sheets of high purity silicon for use in photovoltaic solar cells.

In accordance with the invention, a method is provided for producing high purity silicon which includes forming a copper silicide alloy and positioning this alloy within an enclosure. A filament member is then placed within the enclosure opposite the alloy. The enclosure is filled with a chemical vapor transport gas adapted for transporting silicon. Finally, the filament member and alloy are heated to temperatures sufficient to cause the transport gas to react with silicon at the alloy surface and deposite the reacted silicon onto the filament member surface.

An apparatus is also provided for producing high purity silicon. The apparatus includes an enclosure having a copper silicide alloy disposed therewithin, the alloy being adapted as a source of silicon. A filament member is also disposed within the enclosure opposite the alloy and is adapted for receiving the silicon by deposition. A chemical vapor transport gas adapted for flowing between the alloy and the filament is also disposed within the chamber. Finally, means are provided for heating the filament and the alloy to temperatures sufficient to cause the gas to react with the silicon on the alloy surface and deposit the reacted silicon onto the filament member.

BRIEF DESCRIPTION OF THE DRAWINGS

The novel features which are believed to be characteristic of the invention are set forth in the appended claims. The invention itself, however, together with further objects and attendant advantages thereof, will become further apparent and best understood in the following detailed description taken in connection with the accompanying drawings, setting forth by way of illustration and example certain embodiments of the invention, in which:

DETAILED DESCRIPTION OF THE PREFERRED EMBODIMENTS

Figure 1:
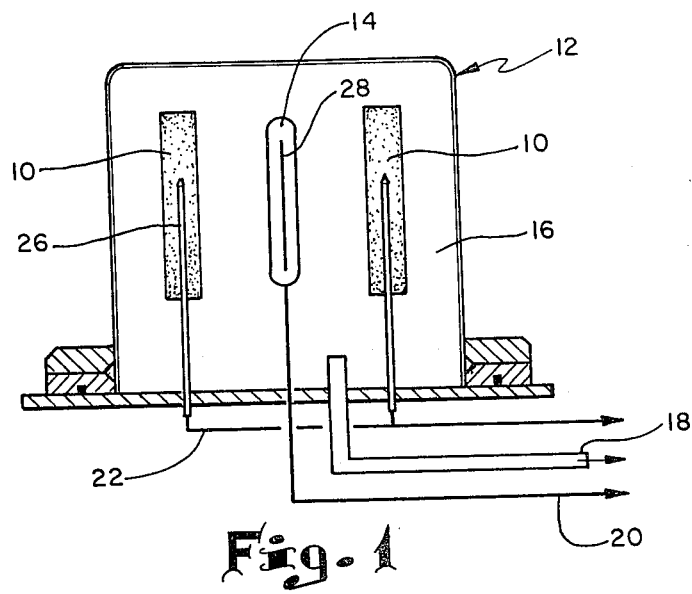
FIG. 1 is a cross-sectional schematic of an apparatus constructed in accordance with the present invention and adapted for carrying out the method of the present invention.

In accordance with a preferred embodiment of the present invention, a method and an apparatus for producing high purity silicon from unrefined silicon is provided. Referring initially to FIG. 1, the unrefined silicon may be in the form of metallurgical grade silicon, which is approximately 98% pure, or in numerous other impure forms. The unrefined silicon is first combined with copper to form a copper silicide alloy. The alloy may be formed into any number of different configurations but is preferably formed into a slab 10. At least one such alloy slab 10 is placed within an enclosure or chamber 12. A filament member 14, which is preferably composed of silicon, is also placed within the enclosure 12 opposite the copper silicide alloy 10. An appropriate chemical vapor transport gas which is adapted for transporting silicon is introduced into the enclosure 12 and fills the void space 16 of enclosure 12. The alloy 10 and the filament 14 are then heated to a temperature sufficient to cause the gas within void space 16 to react with silicon at the surface of the alloy 10. The reacted silicon is then transported and deposited onto the surface of the filament 14 in the form of highly pure silicon.

The impurities present in the unrefined silicon of the alloy 10 are retained therein due to the filtering properties of the copper silicide described in more detail below. Moreover, what few impurities are picked up by the transport gas are retained by the transport gas and not deposited onto the filament 14. The filament structure 14 may be in the form of a flat or planar surface to permit silicon deposition in the form of highly refined silicon sheets thereon. In the alternative, the filament 14 may take any desired shape to form bulk amounts of silicon thereon.

With further reference to FIG. 1, the transport gas is introduced into and removed from the enclosure 12 by line 18. Elements 20 and 22 are utilized in the heating process of the alloy members 10 and filament 14 as described in greater detail below. In preferred form, the enclosure 12 is constructed from quartz so as to be inert to the reactants within the enclosure 12.

Referring to the alloy structure in greater detail, the copper silicide alloy preferably has the general two-phase formula $Si/Cu_{3+x}Si_{1-x}$, wherein x is generally less than about 0.1. The preferred alloy species comprises $Cu_3Si$ in the form of a two-phase defect solid composite which includes a plurality of silicon crystallites 24 interspersed throughout the $Cu_3Si$ structure.

To form the copper silicide alloy, a mixture of the copper and metallurgical grade silicon of any generally appropriate amount is heated to a temperature greater than about 802° C., which is the eutectic temperature of the copper silicide alloy. The greater the percentage of silicon in the mixture and resultant alloy, the higher the liquidus temperature of the alloy mixture. Once the molten alloy is thoroughly mixed, it is gradually cooled to form a solid structure which has a general chemical formula $Cu_{3+x}Si_{1-x}$. This two-phase composite has small crystal-like structures or crystallites of impure silicon randomly interpersed throughout its lattice structure.

The exact amounts of copper and impure silicon used prior to melting and mixing are generally not particularly important. However, no more than about 30 weight percent silicon can be utilized in order to maintain the alloy liquidus temperature within a reasonable limit of about 1000°-1100° C. during the alloy casting process. The reasons that the actual ratio of copper to silicon is not particularly important is that the $Cu_{3+x}Si_{1-x}$ composite structure with silicon crystallites embedded therein will always be formed when a molten mixture of copper and silicon is cooled to below 802° C., the $Si:Cu_{3+x}Si_{1-x}$ phases being in equilibrium.

While the manner in which the copper silicide alloy functions in the method and apparatus of the present invention is not specifically known, it is believed that silicon from the silicon crystallites, as well as the alloy itself once the silicon crystallites are depleted, diffuses through the solid alloy structure. This is believed possible due to the fact that the alloy structure is a defect solid, and the openings in its lattice structure apparently permit solid state diffusion therethrough. However, the silicon impurities do not diffuse through the alloy solid but rather are apparently retained in the alloy structure itself. Thus, the copper silicide alloy acts as a filter for impurities.

At the surface of the alloy structure 10, the transport gas reacts with the silicon so as to form a gaseous silicon compound for transport to the filament 14. While appropriate gas transport means may be utilized, hydrogen halides are preferred. More specifically, hydrogen chloride is the preferred transport gas and reacts with silicon at the surface of the alloy structure 10 to form trichlorosilane in accordance with equation (1) previously described. Due to the unique filtering properties of the alloy structure, however, only nominal impurities are formed with the trichlorosilane. Therefore, the prior art step of distilling the trichlorosilane can be eliminated. As a result, the trichlorosilane is directly transported to the filament member 14 which is at an elevated temperature relative to the alloy 10, whereupon the trichlorosilane deposits the silicon while retaining any minute amounts of impurities. The deposition of the silicon at the hot filament 14 is in accordance with reaction equation (2), previously given. As a result, hydrogen chloride is reformed at the hot filament 14 and becomes available to react with additional silicon at the surface of the alloy structure 10.

When utilizing HCl as a gas transport means, the alloy structure is generally preferably maintained at a temperature range of 650°–750° C. In addition, the hot filament member 14 is preferably maintained at a temperature range of 900°–1100° C. Thus, silicon is transported by the HCl from a cold source to the hot filament member 14, the alloy structure being a cold source only relative to the temperature of the filament 14. As was noted above, other hydrogen halides, such as HF, HBr and HI, may be utilized. However, certain modifications with respect to temperature would be required due to the different boiling points of the hydrogen halides.

Figure 2:
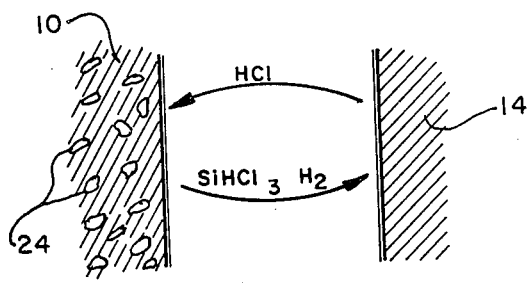
FIG. 2 is a schematic illustrating the chemical vapor transport mechanism of the method and apparatus of the present invention.
Figure 3:
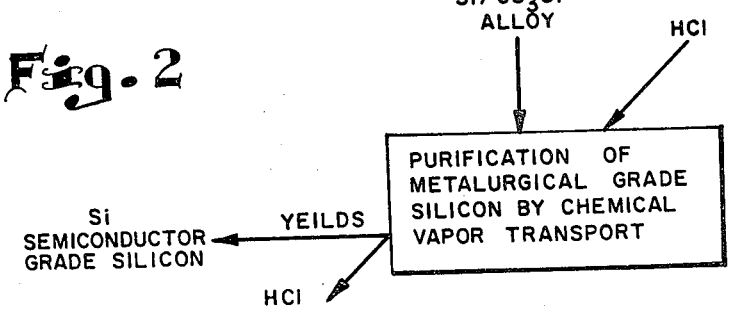
FIG. 3 is a block schematic or flow diagram of one process step of the present invention leading to the production of semiconductor grade silicon.

FIG. 2 clearly illustrates the reaction mechanism discussed above with respect to hydrogen chloride. As the silicon is depleted at the surface of the alloy structure 10, additional silicon from the silicon crystallites 24 as well as from the copper silicide matrix itself diffuses to the surface for reaction with HCl. The full process of the subject invention is also illustrated by the block diagram of FIG. 3.

The filament member 14 may comprise any appropriate material in any appropriate shape. For instance, if it is desired to form thin sheets of highly pure silicon for direct usage in photovoltaic cells. the filament member may be in the form of a flat plate constructed from graphite or other metals such as stainless steel or tungsten. Such materials are desirable since silicon may be readily stripped therefrom after formation thereon. The hot filament 14 may also be composed of silicon itself so that subsequent separation of the formed silicon from the filament member is not required. This would be particularly desirable when a bulk slab of silicon is the desired end product. FIG. 1 illustrates such an example wherein an initial silicon filament member 28 is positioned within the enclosure 12. After a period of hours of operating the invention, the bulk amount of silicon is formed thereon. The examples provided below will more clearly illustrate the capability of such formations utilizing the present invention.

Upon operating the method of the present invention, it was determined that impurities originating from either the metallurgical grade silicon or the copper were distributed more or less uniformly throughout the alloy structure 10 with a possible concentrating of impurities in the last to freeze portion of the alloy when constructing the alloy as described above. Moreover, the operating temperature of the alloy structure was determined to be optimum due to the fact that diffusion of silicon in the copper silicide alloy was very rapid while the diffusion of other impurities like boron, phosphorous, aluminum, and titanium were very slow. Therefore, the transport gas, preferably HCl, which is capable of acting only on the surface of the alloy structure 10, can extract or transport silicon at any reasonable rate, leaving behind impurities that otherwise might have been transported to the hot filament 14. It was also determined that HCl will not transport copper from the alloy structure 10 to the hot filament member 14. Thus, both the transport process at the temperatures disclosed as well as the filtering properties of the copper silicide alloy itself work together to permit the formation of electronic grade silicon at the hot filament member 14. Spark source mass spectroscopy tests of the silicon formed in accordance with the present invention indicated a 99.99999% purity. Such silicon purity is not only utilizable in photovoltaic solar cells, but also in semiconductor devices requiring this electronic grade silicon.

Referring once again to FIG. 1, the apparatus of the present invention further includes a means for heating the filament member 14. In preferred form, AC current is applied to the filament member 28 by power line 20. Thermocouple members 26 are positioned within the alloy structures 10 in order to monitor the temperatures thereof. In preferred form, only the filament member 14 is heated directly. With the preferred positioning of the alloy structures 10 approximately 2 cm from the filament 14, the alloy structures 10 are heated indirectly by convection, radiation and conduction from the hot filament member 14. The temperature of the alloy members 10 in such an arrangement may be regulated by the temperature of the filament member 14 and the distance between the filament member 14 and the alloy structures 10. It is envisioned, however, that direct heating of the alloy structures 10 may also be performed if desired. The apparatus of FIG. 1 is preferably a closed system wherein the void space 16 of the enclosure 12 is filled with a preferred transport gas, HCl, whereupon line 18 is then closed off. Due to the continual regeneration of HCl at the filament member 14, HCl is continuously available to transport silicon from the alloy structures 10 to the filament member 14 in such a closed system. Once the silicon has been depleted from the alloy structures 10, the HCl and other residual gases are vacated from the enclosure 10 via line 18, and the filament member 14 is removed therefrom.

With certain modifications to the above, it is also envisioned, however, that the present invention may be utilized in the form of a flowthrough process somewhat similar to the Siemens reactor process previously referenced. However, certain modifications would be required for such a flowthrough process.

While only a simple configuration of the apparatus of the invention is illustrated herein, it is envisioned that large reactors having multiple sets of alloy structures 10 and filament members 14 may be utilized.

The following examples are illustrative only of the materials, parameters and ranges of materials usable in the present invention.

EXAMPLE I

A copper silicide alloy was saturated with metallurgical grade silicon at 1100° C. in an open air graphite furnace. This molten alloy was then poured into graphite molds to form two slabs with dimensions of approximately $1 \times 5 \times 5$ cm$^3$. These comprised the alloy structures 10 illustrated in FIG. 1. The filament member 14 was a 0.254 mm (⅛″) diameter graphite rod. The two alloy structures and the filament were then placed within a quartz bell jar reactor in accordance with FIG. 1, the reactor having a watercooled, copper base plate to assist in controlling the temperature therewithin. The filament member was positioned horizontally between the two vertical, substantially parallel copper silicide alloy slabs. The spacing between the two alloy slabs was approximately 4 cm. The enclosure or reactor was then evacuated with a mechanical forepump and then backfilled with approximately 440 torr of electronic grade HCl. An electrical current was then fed through the graphite filament to heat it to a temperature of about 1000° C. The steady-state temperatures of the copper silicide alloys were maintained at approximately 400° C. The experiment was then allowed to run for about 1.5 hours, and in that time 0.8 g of silicon were deposited on the graphite filament. This represented a linear growth rate of 600 μm/hr or a mass flux of 0.09 g/cm² hr.

EXAMPLE II

A second experiment was run similar to the conditions existing in Example I with the exception that the alloy slab temperatures were increased to approximately 650° C. by increasing the temperature of the graphite filament. Moreover, the experiment was run for a period of 18 hours. As a result, 3.5 g of silicon were deposited on the graphite filament during this 18 hour period. This represents a linear growth rate of 0.05 cm/hr or a mass flux of 0.023 g/cm² hr. Subsequently, examples of the purified silicon produced in Example II were submitted for analysis by spark source mass spectrometry in accordance with standard techniques. The results of this analysis are illustrated in Table I below. It should be noted that a high degree of segregation is exhibited for all impurities indicated therein.

TABLE I

| Impurity | EXAMPLE II Concentration (ppmw) | EXAMPLE VI Concentration (ppmw) |
|---|---|---|
| W  | <0.1  | <0.1  |
| Sn | 0.11  | <0.1  |
| Cd | <0.16 | <0.16 |
| Mo | <0.15 | <0.15 |
| Ge | <0.24 | <0.1  |
| Ga | 0.10  | 0.24  |
| Zn | 0.17  | 0.34  |
| Cu | 0.28  | 0.34  |
| Ni | 0.53  | <0.27 |
| Fe | 0.30  | <0.26 |
| Ca | 0.13  | 0.3   |
| S  | <0.42 | 0.48  |
| P  | 1.6   | 0.37  |
| Al | 0.94  | 0.15  |
| Zr | <0.13 | <0.13 |
| Mn | <0.11 | <0.11 |
| Ti | <0.1  | <0.1  |
| B  | <0.1  | <0.1  |
| Cr | <0.1  | <0.1  |
| V  | <0.1  | <0.1  |

EXAMPLE III

Another experimental run similar to that of Example II was performed with the exception that instead of a single graphite rod as a filament member, a graphite sheet filament member was utilized having the dimensions of 0.5 mm thick by 2 cm wide. This particular experimental run was performed for 18 hours and yielded 7.1 g of silicon. This represents a linear growth rate of 0.012 cm/hr or a mass flux of 0.017 g/cm² hr. In this particular example, although 7.1 g of silicon were formed, the silicon formed on the graphite sheet was fairly uniform throughout. Moreover, had this experiment been run for a very short period of time, it is expected that a very thin, uniform sheet of highly pure silicon would have been formed. Thus, this example establishes that thin sheets of silicon can be formed directly utilizing the method and apparatus of the present invention rather than forming a block of silicon and having to subsequently cut the silicon to form a thin sheet for photovoltaic uses.

EXAMPLE IV

Another experimental run was made similar to the conditions existing in Example III including the graphite sheet. However, the spacing between the alloy structures 10 was reduced 2 cm with a graphite sheet being placed substantially parallel therebetween. Moreover, this particular run was performed for approximately 68 hours. In this period of time, an incredible total of 22 g of silicon were deposited on the filament sheet member. This represents a mass flux of 0.014 g/cm² hr.

EXAMPLE V

Yet another experimental run was performed similar to that of Example IV utilizing the same spacing except that two graphite filament sheets were sandwiched between three alloy slabs having alloy spacing of 2 cm apart, similar to Example IV. The temperature of the center or innermost alloy structure was approximately 750° C. whereas the temperatures of the two outer alloy structures were approximately 650° C. This particular example yielded 13.8 g Si for a 24 hr run. This represents a growth rate of about 0.006 cm/hr and a mass flux of approximately 0.014 g/cm² hr. It should be noted at this time that a wide variability of silicon yield is the result of various variables which have been changed throughout the examples. Thus, for instance, in this particular example, the fact that the outer alloy structures were at a lower temperature may have had a significant effect on the total amount of silicon produced during the 24 hour experimental run.

EXAMPLE VI

In this example, the conditions were similar to those of Example IV except that the copper silicide alloy slab geometry was replaced with graphite baskets containing 5-10 mm lumps of the copper silicide alloy having the same composition. The single graphite filament utilized in this experiment was 0.25 mm thick and 3 cm wide. The results of this run yielded 12.5 g purified silicon deposited during a 49 hr period. This represents a mass flux of 0.009 g/cm² hr. The resultant silicon produced in Example VI was analyzed similarly to the silicon of Example II, and the results of such analysis are shown in Table I above.

As described above, the method and apparatus of the present invention provide a means of utilizing metallurgical grade silicon for direct production of highly refined silicon capable for use in the photovoltaic solar cell industry, semiconductor industry and the like. The present invention is relatively inexpensive and simple to operate, yet produces silicon of significantly high purity to permit direct use in photovoltaic cells and semiconductor devices. Furthermore, the method and apparatus of the present invention permit formation of highly pure sheets of silicon without having to rely on prior expensive and inefficient sheet formation processes and techniques such as molding, casting, diamond cutting and the like. The method and apparatus of the present invention also permit the use of multiple sets of alloy slab and filament members in a single enclosure to form a plurality of silicon sheets or silicon blocks simultaneously, thereby permitting the formation of large amounts of silicon in a relatively short period of time with a single apparatus. Thus, the method and apparatus of the present invention are inexpensive, efficient, and require no additional steps as in prior processes to produce high purity silicon for a multiplicity of uses.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein but may be modified within the scope of the appended claims.

The embodiments of the invention in which an exclusive property or privilege is claimed are defined as follows:

1. A method for producing high purity silicon comprising:
   forming a copper silicide alloy and positioning said alloy within an enclosure;
   placing a filament member within said enclosure opposite said alloy;
   filling said enclosure with a chemical vapor transport gas adapted for transporting silicon; and
   heating said filament member and said alloy to temperatures sufficient to cause said gas to react with silicon at said alloy surface and deposit said reactive silicon onto said filament member, said alloy being heated to said temperatures sufficient to enable said alloy to diffusionally trap impurities while said gas reacts with said silicon to effect depositing said silicon onto said filament member.

2. A method as claimed in claim 1, wherein said enclosure is a closed system wherein said gas recirculates between said alloy and said filament member.

3. The method as claimed in claim 1, wherein said copper silicide alloy comprises an alloy of $Cu_{3+x}Si_{1-x}$, wherein x is less than about 0.1.

4. The method of claimed in claim 3, wherein said copper silicide alloy includes silicon crystallites interspersed therethrough.

5. The method as claimed in claim 1, wherein said copper silicide alloy comprises an alloy of copper and metallurgical grade silicon.

6. The method as claimed in claim 1, wherein the said filament member comprises a silicon filament.

7. The method as claimed in claim 1, wherein said filament member and said alloy are heated by heating said filament member to a temperature sufficient to indirectly heat said alloy by radiation heating means.

8. The method as claimed in claim 1, wherein said filament member is heated to at least 900° C., and said alloy is heated to at least 650° C.

9. The method as claimed in claim 8, wherein said filament member is heated to approximately 900°–1100° C., and said alloy is heated to approximately 650°–750° C.

10. The method as claimed in claim 1, wherein said gas comprises a hydrogen halide.

11. The method as claimed in claim 10, wherein said hydrogen halide comprises HCl.

12. The method as claimed in claim 1, wherein the purity of said silicon deposited onto said filament member comprises electronic grade silicon.

13. An apparatus for producing high purity silicon comprising:
    enclosure means;
    copper silicide alloy means disposed within said enclosure means and adapted as a source for said high purity silicon;
    filament means disposed within said enclosure means opposite said alloy means and adapted for receiving said silicon by deposition;
    chemical vapor transport gas disposed within said enclosure means and adapted for flowing between said alloy means and said filament means; and p1 means for heating said filament means and said alloy means to temperatures sufficient to cause said gas to react with said silicon on the surface of said alloy means and deposit said reactive silicon onto said filament means, said alloy being adapted to filter impurities defined by said alloy while said gas reacts with said silicon, said temperatures being sufficient to enable said alloy to filter said impurities.

14. The apparatus as claimed in claim 13, wherein said enclosure means comprises a closed system wherein said gas continuously recirculates between said alloy means and said filament means.

15. The apparatus as claimed in claim 13, wherein said apparatus includes a plurality of said alloy means and said filament means.

16. The apparatus as claimed in claim 13, wherein said apparatus includes a plurality of said alloy means surrounding each of said filament means.

17. The apparatus as claimed in claim 13, wherein said alloy means comprises an alloy of copper and metallurgical grade silicon having silicon crystallites interspersed therethrough.

18. The apparatus as described in claim 13, wherein said filament means comprises a silicon filament member.

19. The apparatus as claimed in claim 13, wherein said heating means comprises a heating element for heating said filament means to a temperature sufficient to indirectly heat said alloy means to a temperature substantially lower than the temperature of said filament means.

20. The apparatus as claimed in claim 13, wherein said transport gas comprises a hydrogen halide.

21. A method for producing silicon comprising:
    forming a filter means from a copper silicide alloy and positioning said filter means within an enclosure, said enclosure defining a closed system;
    placing a filament member within said enclosure opposite said filter means;
    filling said enclosure with a chemical vapor transport gas adapted for transporting silicon; and
    heating said filament member and said filter means to temperatures sufficient to cause said gas to react substantially solely with silicon at a surface of said filter means and deposit said reactive silicon onto said filament member.

* * * * *